United States Patent [19]

Nagaishi et al.

[11] Patent Number: 5,258,366
[45] Date of Patent: Nov. 2, 1993

[54] LASER EVAPORATION METHOD FOR FORMING HIGH TC SUPERCONDUCTING FILMS

[75] Inventors: Tatsuoki Nagaishi; Hidenori Nakanishi; Saburo Tanaka; Hideo Itozaki, all of Hyogo, Japan

[73] Assignee: Sumitomo Electric Industries, Ltd., Osaka, Japan

[21] Appl. No.: 921,336

[22] Filed: Jul. 29, 1992

[30] Foreign Application Priority Data

Jul. 29, 1991 [JP] Japan ............................ 3-211504

[51] Int. Cl.$^5$ ............................ B05D 3/06; B05D 5/12
[52] U.S. Cl. .................................... 505/1; 505/732; 505/730; 427/62; 427/596; 427/314
[58] Field of Search ................. 505/1, 732, 730; 427/62, 63, 596, 314

[56] References Cited

U.S. PATENT DOCUMENTS 5,094,880 3/1992 Hongoh .................. 427/62

OTHER PUBLICATIONS

Koren et al., "Highly oriented as-deposited superconducting laser ablation thin films of $Y_1Ba_2Cu_3O_{7-\delta}$ on $SrTiO_3$, zirconia, and Si substrates", Appl. Phys. Lett. 53(23) Dec. 1988 pp. 2330–2332.

Dijkkamp et al., "Preparation of Y-Ba-Cu Oxide superconductor thin films using pulsed laser evaporation from high Tc bulk material", Appl. Phys. lett. vol. 51, No. 8, aug. 1987 pp. 619–621.

Primary Examiner—Roy King
Attorney, Agent, or Firm—Kerkam, Stowell, Kondracki & Clarke

[57] ABSTRACT

Improvement in a method for preparing a superconducting thin film of compound oxide on a substrate (6) by laser evaporation technique. A rear surface of a target (7) used is cooled forcedly by a cooling system (9) during film formation.

9 Claims, 1 Drawing Sheet

LASER EVAPORATION METHOD FOR FORMING HIGH TC SUPERCONDUCTING FILMS

BACKGROUND OF THE INVENTION

1. Field of the Invention

The present invention relates to an improvement in a method for preparing a superconducting thin film of compound oxide having a smooth surface by laser evaporation technique.

2. Description of the Related Art

Superconductivity has been thought, for a long time, to be a phenomenon observable at ultra-low temperatures realized with liquid helium as a cryogen. However, the possibility of an existence of a new type of superconducting material was revealed by Bednorz and Müller, who discovered $(La, Sr)_2CuO_4$ which exhibits the superconductivity at 30 K in 1986. C. W. Chu et al. discovered, in the United States of America, another superconducting material of $YBa_2Cu_3O_{7-\delta}$ having the critical temperature of about 90K in 1987. Maeda et al discovered so-called bismuth type superconducting material. And hence, the possibility of an actual utilization of high-Tc superconductors has burst onto the scene because the superconductivity can be realized with cheap cryogen of liquid nitrogen.

The new type superconducting materials were obtained in a form of sintered mass prepared by powder metallurgy but now they can be prepared in a thin film form of very high quality.

Laser evaporation technique is one of the most promising techniques. In fact, superconducting thin films which exhibit improved superconducting properties can be prepared by the laser evaporation technique with no after-treatment such as annealing of thin films deposited on a substrate.

It is true that a superconducting thin film of the oxide of high quality can be prepared by the laser evaporation technique but the laser evaporation technique has the disadvantage that undesirable fine particles of oxide are produced on a surface the thin film obtained. Existence of such fine particles is undesirable for fabricating superconducting devices in which smoothness of the superconducting thin film is requested.

Therefore, an object of the present invention is to solve the problem and to provide a novel process for preparing a superconducting thin film of oxide possessing an improved surface property by the laser evaporation technique.

SUMMARY OF THE INVENTION

The present invention provides a process for preparing a superconducting thin film of compound oxide on a substrate by laser evaporation technique, characterized in that a rear surface of a target used is cooled forcedly during film formation.

The present inventors examined the power level of a laser beam impinging onto a target during the laser evaporation and found such a fact the power level fluctuates or varies in time. On the other hand, a laser beam has a power distribution having an intense peak at the center of a spot of the laser beam on a surface of a target. From these facts, a complete plume can not be created at a zone that is not given with enough power of laser. Target material scattered or vaporized from such zone is condensed and deposited on a surface of target to produce undesirable fine particles of oxide.

According to the present invention, a rear surface of target is forced to be cooled during the laser evaporation operation so that the target is cooled compulsorily to prevent scattering of target material from the above-mentioned zone where the laser beam has not satisfactory power level, with the result that formation or deposition of the fine particles of oxide is prevented effectively.

In the laser evaporation method, a laser beam impinges onto a surface of a target to create a spot of the laser beam on the surface. As stated above, the spot has a predetermined radial distribution of laser power in such a manner that the center of spot has the most intense laser power as well as the power level of laser beam fluctuates or varies in time during the laser evaporation operation. Theoretical explanation of mechanism why the surface property of a thin film obtained is improved by cooling the target according to the present invention can't be given at this stage.

The cooling of the rear surface of target can be effected by any known technique. In a preferred embodiment, a cooling pipe is installed inside a target holder and cooling liquid such as water is circulated through the cooling pipe. The cooling liquid is circulated through a cooling unit located outside a vacuum chamber.

Temperature of the rear surface of target to be cooled can be determined by experiment. For example, the rear surface of target is cooled down to 10° C. when a laser beam having a energy density of 1.5 to 2.0 $J/cm^2$ is impinged onto an oxide target having a thickness of 2 mm at a distance between the target and the substrate of 50 mm. The power level depend mainly on kinds of target material and can be found easily by experiment. Usually, the rear surface of target is cooled to a temperature lower than 30° C. during the evaporation. There is no special lower limit of this temperature.

In a process according to the present invention, a thinner target is advantageously used in order to increase the cooling efficiency from a rear surface to a surface of the target. The target has preferably a thickness of less than 5 mm, more preferably less than 2 mm.

The laser evaporation technique itself is well-known and usual operational conditions can be used in the present invention. Followings are typical operational conditions:

Substrate temperature: 600° to 700° C.
Gas pressure in chamber: 100 to 1,000 m Torr
Distance between the target and the substrate: 40 to 100 mm
Laser density: 1.0 to 3.0 $J/cm^2$
Deposition rate: 10 to 1,000 Å/min Any laser can be used but an excimer laser is usually used.

The substrate is preferably a single crystal substrate of oxide such as $MgO$, $SrTiO_3$, $LaAlO_3$, $LaGaO_3$ and yttrium stabilized zirconia (YSZ).

The process according to the present invention can be used for preparing thin films of any known high-Tc superconductors such as La-Sr(Ba)-Cu-O, Y-Ba-Cu-O, Bi-Sr-Ca-Cu-O and Tl-Ba-Ca-Cu-O.

The process according to the present invention permits the stable or reproducible preparation of a superconducting thin film of compound oxide possessing improved surface condition and superconducting properties.

Figure 1:
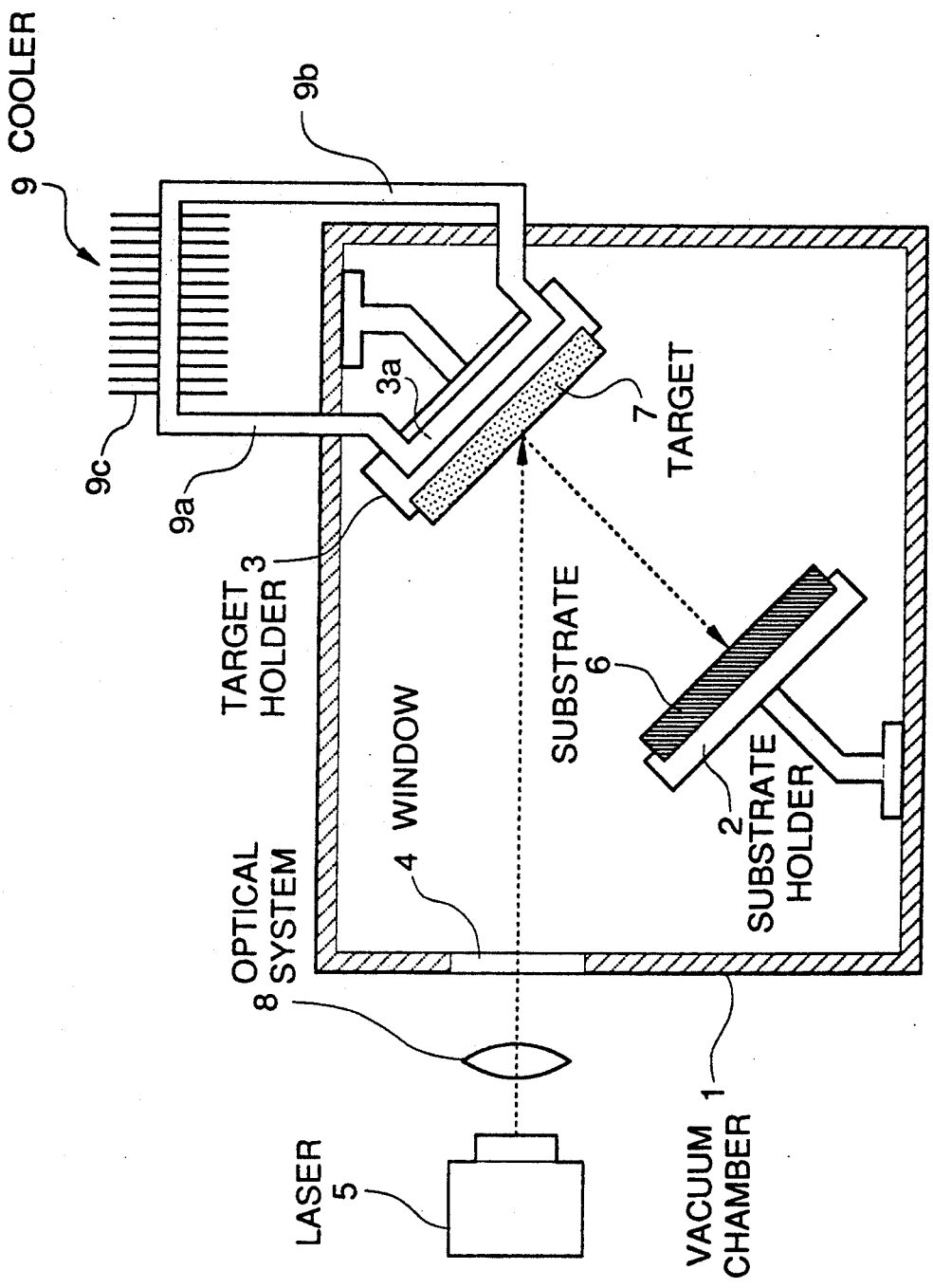
FIG. 1 illustrates a structure of a film forming apparatus which can be used in the process according to the present invention.

The film forming apparatus shown in FIG. 1 comprises a vacuum chamber 1 in which a substrate holder 2 and a target holder 3 are positioned and a laser 5 which emits a laser beam to a target through a transparent window 4 secured to the vacuum chamber 1.

The substrate holder 2 and the target holder 3 are constructed in such a manner that each of substrate 6 and target 7 can be positioned at desired level, orientation and angle. The laser beam emitted from the laser 5 is converged by an optical system 8.

The target holder 3 is provided with a water jacket $3a$ communicated with a circulation circuit $9a$, $9b$ and $9c$. The circulation circuit $9c$ has a cooler 9.

The target 7 held on the target holder 3 can be cooled effectively by the water jacket $3a$ during film formation operation.

DESCRIPTION OF THE PREFERRED EMBODIMENT

Now, the present invention will be described with reference to the Example, but the scope of the invention should not be limited to the Example.

A superconducting thin film of Y-type compound oxide is made by using the apparatus shown in FIG. 1.

A thin film was deposited on a (100) plane of MgO single crystal substrate by laser evaporation method. As a target, a sintered body of compound oxide having a composition of $YBa_2Cu_3O_y$ was used. Operational conditions used are summarized in Table 1.

TABLE 1

| Substrate temperature | 700 (°C.) |
|---|---|
| Gas pressure | 400 (mTorr) |
| Laser energy density | 1.5 to 2.0 (J/cm$^2$) |
| Film thickness | 2,000 (Å) |

The target 7 was secured to the cooled target holder 3 through silver paste so as to realize high thermal conductivity or contact. The distance between the target and the substrate was adjusted to 70 mm and the deposition rate was adjusted to 300 Å/min.

In order to evaluate the resulting sample (sample 1), the same procedure as above was repeated to prepare another sample (sample 2) in the same apparatus but the target was not cooled.

The density of oxide particles produced on a surface of the substrate was determined by a scanning electron microscopy (SEM) and the superconducting properties were measured by conventional methods.

The results are summarized in Table 2. The critical current density (Jc) was determined at 77K.

TABLE 2

| Sample | Critical temperature (K.) | Critical current density (A/cm$^2$) | Density of oxide particle (number/cm$^2$) |
|---|---|---|---|
| 1 | 90 | $5 \times 10^6$ | $5 \times 10^5$ |
| 2 | 90 | $2 \times 10^6$ | $3 \times 10^7$ |

What is claimed is:

1. In a method for preparing a high Tc superconducting film of compound oxide on a substrate by laser evaporation technique, the improvement comprising forcedly cooling, during film formation, a rear surface of a target being used.

2. The method set forth in claim 1 wherein the rear surface of the target is cooled to a temperature lower than 30° C. during the evaporation.

3. The method set forth in claim 1 wherein the target has a thickness of less than 5 mm.

4. The method set forth in claim 1 wherein a laser beam has a energy density of between 1.0 and 3.0 J/cm$^2$.

5. The method set forth in claim 1 wherein the substrate is heated at a temperature between 600° and 750° C.

6. The method set forth in claim 1 wherein the gas pressure in an evaporation chamber is adjusted between 100 and 1,000 m Torr.

7. The method set forth in claim 1 wherein the distance between the target and the substrate is adjusted between 40 and 100 mm.

8. The method set forth in claim 1 wherein the deposition rate is adjusted between 10 and 1,000 Å/min.

9. The method set forth in claim 1 wherein the compound oxide is selected from the group consisting of La-Sr(Ba)-Cu-O, Y-Ba-Cu-O, Bi-Sr-Ca-Cu-O and Tl-Ba-Ca-Cu-O.

* * * * *